US008952732B2

(12) United States Patent
Kawasaki

(10) Patent No.: US 8,952,732 B2
(45) Date of Patent: Feb. 10, 2015

(54) SIGNAL PROCESSOR WITH FREQUENCY CONVERTERS AND P/S CONVERTERS AND SIGNAL PROCESSING METHOD USING SAME

(75) Inventor: Kenichi Kawasaki, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/984,974

(22) PCT Filed: Feb. 8, 2012

(86) PCT No.: PCT/JP2012/000844
§ 371 (c)(1),
(2), (4) Date: Aug. 12, 2013

(87) PCT Pub. No.: WO2012/111278
PCT Pub. Date: Aug. 23, 2012

(65) Prior Publication Data
US 2013/0342244 A1  Dec. 26, 2013

(30) Foreign Application Priority Data
Feb. 17, 2011  (JP) ................... 2011-032340

(51) Int. Cl.
*H03B 19/00* (2006.01)
(52) U.S. Cl.
USPC ............ 327/119; 327/120; 327/295; 327/407
(58) Field of Classification Search
USPC ................... 327/119, 120, 295, 407
See application file for complete search history.

(56) References Cited

U.S. PATENT DOCUMENTS

| 4,752,941 | A | * | 6/1988 | Takahara et al. ............. 375/347 |
| 6,535,587 | B1 | | 3/2003 | Kobayashi |
| 7,043,271 | B1 | * | 5/2006 | Seto et al. ................. 455/562.1 |
| 7,778,613 | B2 | * | 8/2010 | Seendripu et al. ........... 455/130 |
| 8,503,590 | B2 | * | 8/2013 | Tsukamizu et al. .......... 375/347 |
| 2011/0165847 | A1 | | 7/2011 | Kawasaki |

FOREIGN PATENT DOCUMENTS

| CN | 101035104 A | 9/2007 |
| JP | 2000-332812 | 11/2000 |
| JP | 2010-103982 | 5/2010 |

OTHER PUBLICATIONS

Chinese Office Action issued in connection with related Chinese patent application No. 201280008352.0 dated May 9, 2014.
R. Palmer, J. Poulton, et al., "A 14 mW 6.25 Gb/s Transceiver in 90 nm CMOS for Serial Chip-to-Chip Communications", 2007 IEEE International Solid-State Circuits Conference, Digest of Technical Papers, ISSCC 2007.
Japanese Office Examination Report issued in connection with related Japanese patent application No. 2011-032340 dated Aug. 26, 2014.

* cited by examiner

*Primary Examiner* — Kenneth B. Wells
(74) *Attorney, Agent, or Firm* — Dentons US LLP

(57) ABSTRACT

A signal processor includes: a plurality of frequency converters which perform frequency conversion of input signals to output converted signals; and an output section which combines the converted signals output from the plurality of frequency converters and outputs a composite signal, wherein the plurality of frequency converters are formed in a one-chip semiconductor chip, and the plurality of frequency converters perform frequency conversion into converted signals in different frequency bands.

18 Claims, 9 Drawing Sheets

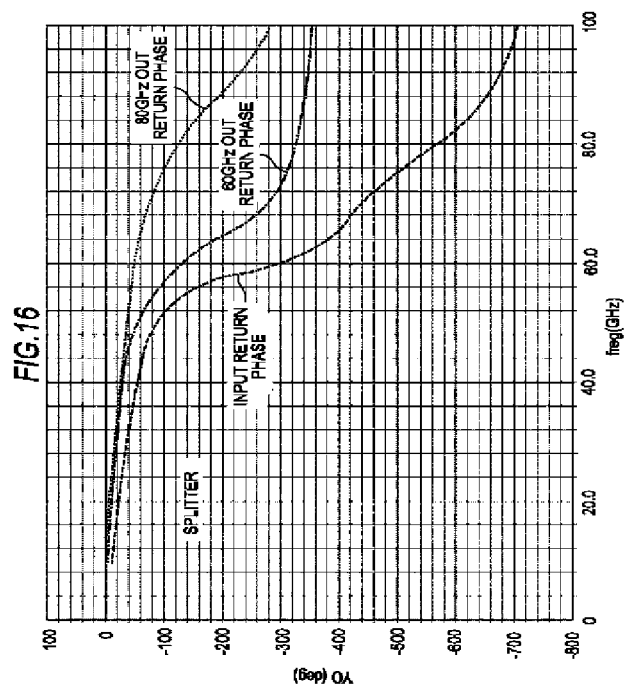

SIGNAL PROCESSOR WITH FREQUENCY CONVERTERS AND P/S CONVERTERS AND SIGNAL PROCESSING METHOD USING SAME

TECHNICAL FIELD

The present disclosure relates to a signal processor and a signal processing method and in particular, to a signal processor and a signal processing method which make it possible to perform high-speed data transmission easily in a semiconductor chip, for example.

BACKGROUND ART

There are a method of performing data transmission in parallel and a method of performing data transmission in series as examples of a method for data exchange between semiconductor chips.

In the case of performing data transmission in parallel, data transmission can be performed at high speed compared with the case of performing data transmission in series.

In addition, when performing data transmission in parallel, the data transmission can be performed at higher speed by increasing the bus width.

In the case of performing data transmission in parallel, however, the number of wiring lines in a semiconductor chip or the number of pins of a semiconductor chip is increased compared with the case of performing data transmission in series.

In addition, if the bus width is increased when performing data transmission in parallel, it becomes difficult to adjust the timing of transmission or reception of each bit of data transmitted in parallel (parallel data).

As described above, since the number of wiring lines in a semiconductor chip or the number of pins of a semiconductor chip is increased when performing data transmission in parallel, a method of performing data transmission in series is adopted when there are restrictions on the number of wiring lines in a semiconductor chip or the number of pins of a semiconductor chip.

Meanwhile, in the case of transmitting parallel data in series, it is necessary to perform P/S (Parallel/Serial) conversion for converting parallel data into serial data at the transmission side and to perform S/P (Serial/Parallel) conversion for converting data transmitted in series (serial data) into parallel data at the receiving side.

As a semiconductor chip which performs P/S conversion and S/P conversion, there is a semiconductor chip called a SERDES (Serializer/De-serializer) (for example, refer to NPL 1).

FIG. 1 is a block diagram showing an example of the configuration of an SERDES in the related art.

In FIG. 1, the SERDES has a serializer 10 and a de-serializer 20.

The serializer 10 has a bit converter 11, a P/S converter 12, a driver 13, and a pad.

For example, 8-bit parallel data is supplied from the high-order application (not shown) to the bit converter 11.

The bit converter 11 converts the 8-bit (width) parallel data from the high-order application into 10-bit parallel data in order to prevent 0 or 1 (low or high) from continuing for a long time in serial data and supplies the 10-bit parallel data to the P/S converter 12.

The P/S converter 12 converts the 10-bit parallel data from the bit converter 11 into serial data and supplies the serial data to the driver 13.

The driver 13 is driven according to the serial data from the P/S converter 12 and outputs a signal according to the serial data.

An output of the driver 13 is connected to a pad (electrode) 14, and the signal output from the driver 13 is output to the outside of the SERDES through the pad 14 and a wiring line provided in the pad 14.

The de-serializer 20 has a pad 21, a receiver 22, an equalizer 23, a CDR (Clock and Data Recovery) 24, an S/P converter 25, a word alignment section 26, and a bit converter 27.

A signal of serial data output from another SERDES is supplied to the receiver 22 through the pad 21, for example.

The receiver 22 receives the signal supplied through the pad 21 and supplies the signal to the equalizer 23.

The equalizer 23 equalizes the signal from the receiver 22 and supplies the result to the CDR 24.

The CDR 24 generates a clock from the signal supplied from the equalizer 23 and outputs the serial data to the S/P converter 25 according to the clock.

The S/P converter 25 converts the serial data from the CDR 24 into parallel data and supplies the parallel data to the word alignment section 26.

The word alignment section 26 performs word alignment of the parallel data from the S/P converter 25 and supplies to the bit converter 27 10-bit parallel data obtained as a result, for example.

The bit converter 27 converts the 10-bit parallel data from the word alignment section 26 into 8-bit parallel data by performing inverse conversion of the conversion of the bit converter 11 and supplies the 8-bit parallel data to the high-order application.

In recent years, however, the amount of data treated in the high-order application has increased, that is, the data transmission speed has increased.

In order to transmit the data at high speed, it is necessary to increase the operation speed of the SERDES.

However, if the operation speed of the SERDES is increased, attenuation of a signal in wiring lines extending from the pads 14 and 21 to the outside of the SERDES becomes large and the frequency band of a signal becomes wide. Accordingly, since (impedance) matching becomes difficult, reflection or radiation occurs easily.

In addition, in order to compensate for the attenuation of a signal or the like, it is necessary to provide the equalizer 23 in the SERDES.

Here, if the attenuation of a signal or the like is not large, it is not necessary to provide the equalizer 23 in the SERDES. However, in order to increase the operation speed of the SERDES, it is necessary to provide the equalizer 23 in the SERDES since the attenuation of a signal or the like becomes large.

In addition, in order to increase the operation speed of the SERDES, it is necessary to increase the operation speed of the P/S converter 12, the driver 13, the receiver 22, the CDR 24, and the S/P converter 25 which are a block for processing of serial data in the SERDES. In this case, however, power consumption of the block for processing of serial data is increased.

Therefore, the increase in the operation speed of the SERDES is restricted by electric power which can be supplied to the SERDES, and increasing the speed further is difficult.

CITATION LIST

Non Patent Literature

[NPL 1] "R. Palmer, J. Poulton, W. J. Dally, J. Eylesl, A. M. Fullerl, T. Greer, M. Horowitz, M. Kellam, F. Quan, F.

Zarkeshvari, "A 14 mW 6.25 Gb/s Transceiver in 90 nm CMOS for Serial Chip-to-Chip Communications", 2007 IEEE International Solid-State Circuits Conference, DIGEST OF TECHNICAL PAPERS, ISSCC 2007"

SUMMARY OF INVENTION

Technical Problem

As described above, performing high-rate data transmission (high-speed data transmission) in the SERDES may be difficult due to power consumption. Moreover, also in a semiconductor chip other than the SERDES, performing high-speed data transmission may be similarly difficult due to power consumption.

Thus, it is desirable to make it possible to perform high-speed data transmission easily.

Solution to Problem

A first embodiment of the present disclosure is directed to a one-chip semiconductor chip in which a plurality of frequency converters that perform frequency conversion of input signals to output converted signals are formed. In the signal processor, the plurality of frequency converters perform frequency conversion into converted signals in different frequency bands, and the converted signals output from the plurality of frequency converters are combined to output a composite signal.

The first embodiment of the present disclosure is also directed to a signal processing method including: performing frequency conversion into converted signals in different frequency bands by means of a plurality of frequency converters of a signal processor, which is a one-chip semiconductor chip in which the plurality of frequency converters that perform frequency conversion of input signals to output converted signals are formed; combining the converted signals output from the plurality of frequency converters to output a composite signal.

According to the first embodiment described above, the plurality of frequency converters of the signal processor, which is a one-chip semiconductor chip in which the plurality of frequency converters that perform frequency conversion of input signals to output converted signals are formed, perform frequency conversion into converted signals in different frequency bands. Then, the converted signals output from the plurality of frequency converters are combined to output a composite signal.

A second embodiment of the present disclosure is directed to a one-chip semiconductor chip in which a plurality of frequency converters, which perform frequency conversion of converted signals obtained by performing frequency conversion of input signals to output the input signals, are formed. In the signal processor, the plurality of frequency converters perform frequency conversion of converted signals in different frequency bands. To each of the plurality of frequency converters, at least a converted signal in a frequency band to be frequency-converted by the frequency converter, of a composite signal obtained by combining a plurality of converted signals in different frequency bands, is distributed.

The second embodiment of the present disclosure is also directed to a signal processing method including: performing frequency conversion of converted signals in different frequency bands by means of a plurality of frequency converters of a signal processor, which is a one-chip semiconductor chip in which the plurality of frequency converters that perform frequency conversion of converted signals obtained by performing frequency conversion of input signals to output the input signals are formed; and distributing to each of the plurality of frequency converters at least a converted signal in a frequency band, which is to be frequency-converted by the frequency converter, of a composite signal obtained by combining a plurality of converted signals in different frequency bands.

According to the second embodiment described above, the plurality of frequency converters of the signal processor, which is a one-chip semiconductor chip in which a plurality of frequency converters that perform frequency conversion of converted signals obtained by performing frequency conversion of input signals to output the input signals are formed, perform frequency conversion of converted signals in different frequency bands. In this case, to each of the plurality of frequency converters, at least a converted signal in a frequency band, which is to be frequency-converted by the frequency converter, of the composite signal obtained by combining the plurality of converted signals in different frequency bands, is distributed.

A third embodiment of the present disclosure is directed to a one-chip semiconductor chip in which a plurality of first frequency converters, which perform frequency conversion of input signals to output converted signals, and a plurality of second frequency converters, which perform frequency conversion of the converted signals to output the input signals, are formed. The plurality of first frequency converters perform frequency conversion into converted signals in different frequency bands, the converted signals output from the plurality of first frequency converters are combined, and a composite signal is output. The plurality of second frequency converters perform frequency conversion of the converted signals in different frequency bands. To each of the plurality of frequency converters, at least a converted signal in a frequency band to be frequency-converted by the frequency converter, of a composite signal from another semiconductor chip, is distributed.

According to the third embodiment of the present disclosure, the plurality of first frequency converters of the signal processor, which is a one-chip semiconductor chip in which the plurality of first frequency converters that perform frequency conversion of input signals to output converted signals and the plurality of second frequency converters that perform frequency conversion of the converted signals to output the input signals are formed, perform frequency conversion into converted signals in different frequency bands. Then, the converted signals output from the plurality of first frequency converters are combined to output a composite signal. On the other hand, the plurality of second frequency converters perform frequency conversion of the converted signals in different frequency bands. To each of the plurality of frequency converters, at least a converted signal in a frequency band to be frequency-converted by the frequency converter, of the composite signal from another semiconductor chip, is distributed.

Advantageous Effects of Invention

According to the first to third embodiments of the present disclosure, high-speed data transmission can be performed easily.

BRIEF DESCRIPTION OF DRAWINGS

FIG. 16 is a view showing the phase characteristics of the 60 G receiving amplifier, the 80 G receiving amplifier, and the splitter 42.

DESCRIPTION OF EMBODIMENTS

Signal Processor According to an Embodiment of the Present Disclosure

Figure 2:
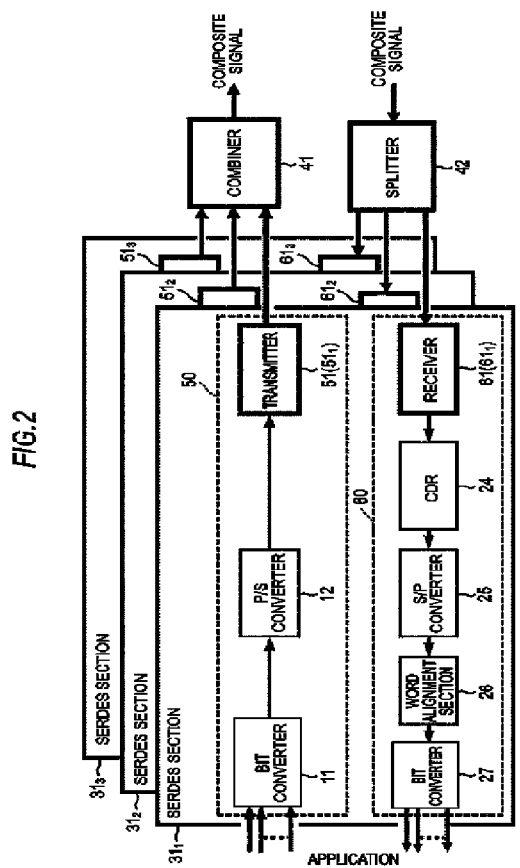
FIG. 2 is a block diagram showing the configuration of a signal processor according to an embodiment of the present disclosure.

FIG. 2 is a block diagram showing an example of the configuration of a signal processor according to an embodiment of the present disclosure.

In FIG. 2, the signal processor is a one-chip semiconductor chip which functions as an SERDES, for example.

In addition, in FIG. 2, the same reference numerals are given to components corresponding to those in FIG. 1, and the explanation will be appropriately omitted hereinbelow.

The signal processor shown in FIG. 2 includes a plurality of, for example, three SERDES sections $31_1$, $31_2$, and $31_3$, a combiner 41, and a splitter 42. These SERDES sections $31_1$ to $31_3$, the combiner 41, and the splitter 42 are formed, for example, on a CMOS (Complementary Metal Oxide Semiconductor) which is a one-chip semiconductor chip.

The SERDES section $31_1$ has a serializer 50 and the de-serializer 60.

The serializer 50 has a bit converter 11, a P/S converter 12, and a transmitter 51.

Figure 1:
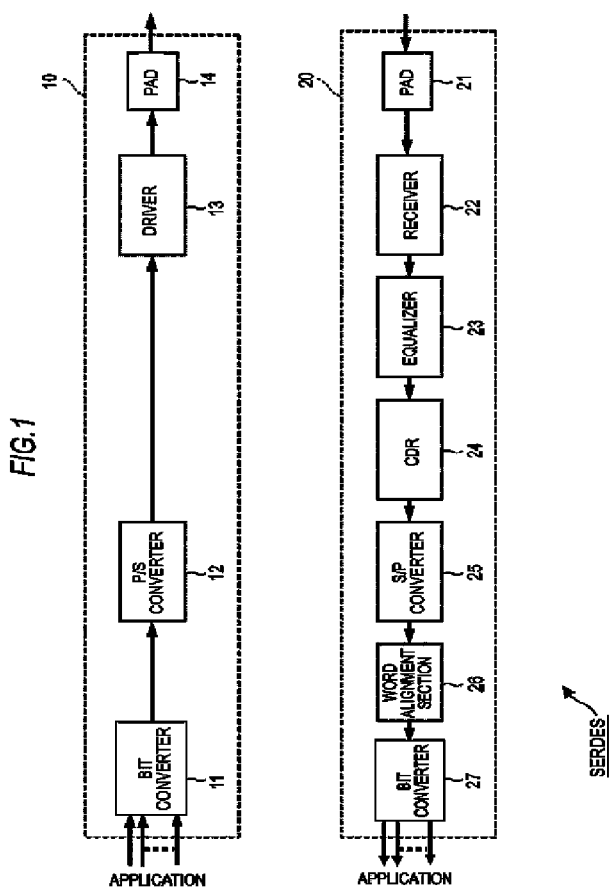
FIG. 1 is a block diagram showing the configuration of an example of an SERDES in the related art.

Accordingly, the serializer 50 is the same as the serializer 10 shown in FIG. 1 in that the bit converter 11 and the P/S converter 12 are provided but is different from the serializer 10 shown in FIG. 1 in that the transmitter 51 is provided instead of the driver 13 and the pad 14.

Serial data are supplied from the P/S converter 12 to the transmitter 51.

The transmitter 51 performs frequency conversion of the serial data from the P/S converter 12, which is a baseband signal (signal in a predetermined frequency band), and outputs a converted signal (converted signal in a higher frequency band than the predetermined frequency band) which is a signal in a high frequency band.

Accordingly, the transmitter 51 functions as a frequency converter which performs frequency conversion of the baseband signal into the converted signal which is a signal in a high frequency band.

The converted signal output from the transmitter 51 is supplied to a combiner 41 by cable line (wiring line).

The de-serializer 60 has a receiver 61, a CDR 24, an S/P converter 25, a word alignment section 26, and a bit converter 27.

Accordingly, the de-serializer 60 is the same as the de-serializer 20 shown in FIG. 1 in that the CDR 24, the S/P converter 25, the word alignment section 26, and the bit converter 27 are provided but is different from the de-serializer 20 shown in FIG. 1 in that the receiver 61 is provided instead of the receiver 22 and the equalizer 23.

At least a converted signal is supplied from the splitter 42 to the receiver 61.

The receiver 61 performs frequency conversion of the converted signal from the splitter 42 and outputs the serial data which is a baseband signal.

Accordingly, the receiver 61 functions as a frequency converter which performs frequency conversion of the converted signal, which is a signal in a high frequency band, into the baseband signal.

The serial data output from the receiver 61 is supplied to the CDR 24 and is processed in the same manner as in the case of the de-serializer 20 shown in FIG. 1.

The SERDES sections $31_2$ and $31_3$ are formed similar to the SERDES section $31_1$.

However, in the SERDES section $31_2$, a transmitter corresponding to the transmitter 51 performs frequency conversion into a converted signal in a different frequency band from those of the other SERDES sections $31_1$ and $31_3$.

In addition, in the SERDES section $31_2$, a receiver corresponding to the receiver 61 performs frequency conversion into a converted signal in a different frequency band from those of the other SERDES sections $31_1$ and $31_3$.

The same is true for the SERDES section $31_3$.

Hereinafter, the bit converter 11, the P/S converter 12, the CDR 24, the S/P converter 25, the word alignment section 26, the bit converter 27, the serializer 50, the transmitter 51, the de-serializer 60, and the receiver 61 (blocks corresponding to these) of the SERDES section $31_i$ are appropriately expressed as a bit converter $11_i$, a P/S converter $12_i$, a CDR $24_2$, an S/P converter $25_2$, a word alignment section $26_2$, a bit converter $27_i$, a serializer $50_i$, a transmitter $51_i$, a de-serializer $60_i$, and a receiver $61_i$, respectively, using a subscript index i.

In addition, the center frequency of the converted signal output from the transmitter $51_i$ of the SERDES section $31_i$ is expressed as $fs_i$, and the center frequency of the converted signal to be frequency-converted by the receiver $61_i$ of the SERDES section $31_i$ is expressed as $fr_i$.

Frequencies $fs_1$, $fs_2$, and $fs_3$ are different from each other, and frequencies $fr_1$, $fr_2$, and $fr_3$ are also different from each other.

In addition, the frequency $fs_i$ (here i=1, 2, 3) and the frequency $fr_{i'}$ (here I'=1, 2, 3) may be different or equal.

When a composite signal to be adjusted is transmitted or received through a common (the same) transmission path, it is possible to perform transmission and reception of data simultaneously in the signal processor shown in FIG. 2 if the frequencies $fs_i$ and $fr_{i'}$ are different for all combinations of i and i'. However, if the frequencies $fs_i$ and $fr_{i'}$ are equal for even one of the combinations of i and i', it is necessary to perform the transmission and reception of data in a time-division manner (half-duplex communication) in the signal processor shown in FIG. 2.

Moreover, if frequencies corresponding to the frequencies $fs_i$ and $fr_i$ are expressed as frequencies $fs_i'$ and $fr_i'$, respectively, in another signal processor which transmits/receives data to/from the signal processor shown in FIG. 2 and is configured similar to the signal processor shown in FIG. 2, the frequencies $fs_i$ and $fr_i'$ match each other and the frequencies $fr_i$ and $fs_i'$ match each other.

The combiner 41 combines the converted signals output from the transmitters $51_1$ to $51_3$ of the SERDES sections $31_1$ to $31_3$ and outputs a composite signal.

Here, the combiner 41 may be formed by a BPF (Band Pass Filter) (here, three BPFs) which is for restricting a frequency band of a converted signal having the frequency $fs_i$ as its center frequency, which is output from the transmitter $51_i$ of the SERDES section $31_i$, to a predetermined band width and a connection point which connects connection lines of outputs of three BPFs that restrict the frequency bands of converted signals output from the transmitters $51_1$ to $51_3$, for example.

Now, the BPF for restricting the frequency band of the converted signal having the frequency $fs_i$ as its center frequency which is output from the transmitter $51_i$, among the three BPFs provided in the combiner 41, is expressed as BPF#i. Then, in the combiner 41 formed by the three BPF#1, BPF#2, and BPF#3 and a connection point which connects connection lines of the outputs of the three BPF#1 to BPF#3, the frequency band of the converted signal output from the transmitter $51_i$ is restricted by the BPF#i. Then, the converted signals output from the three BPF#1 to BPF#3 are combined at the connection point which connects the connection lines of the outputs of the three BPF#1 to BPF#3.

In addition, the combiner 41 may be formed without a BPF, for example. That is, the combiner 41 may be formed by only the connection point of outputs of the transmitters $51_1$ to $51_3$. Detailed explanation thereof will be given later.

A composite signal output from the combiner 41, that is, a signal obtained by frequency multiplexing of the converted signals output from the transmitters $51_1$ to $51_3$ is transmitted to another signal processor by cable or wirelessly through a pad (not shown).

The composite signal transmitted by cable or wirelessly is supplied from another signal processor to the splitter 42 through a pad (not shown).

The splitter 42 distributes to each of the receivers $61_1$ to $61_3$ of the SERDES sections $31_1$ to $31_3$ at least a converted signal in a frequency band which is included in the composite signal supplied thereto and is to be frequency-converted by the receiver $61_i$, that is, a converted signal having the frequency $fr_i$ as its center frequency.

Here, the splitter 42 may be formed by a BPF (Band Pass Filter) (here, three BPFs) for extracting a converted signal, which has the frequency $fr_i$ as its center frequency and is to be frequency-converted by the receiver $61_i$ of the SERDES section $31_i$, from the composite signal and a connection point which makes a connection of connection lines of inputs of the three BPFs, for example.

Now, a BPF for extracting a converted signal having the frequency $fr_i$ as its center frequency among the three BPFs provided in the splitter 42 is expressed as BPF'#i. Then, in the splitter 42 formed by the three BPF'#1, BPF'#2, and BPF'#3 and a connection point which connects connection lines of the inputs of the three BPF'#1 to BPF'#3, the composite signal is supplied to each of the three BPF'#1 to BPF'#3 from the connection point which connects the connection lines of the inputs of the three BPF'#1 to BPF'#3. Then, in the BPF'#i, a converted signal having the frequency $fr_i$ as its center frequency is extracted and is then supplied (distributed) to the receiver $61_i$.

In addition, the splitter 42 may be formed without a BPF, for example. That is, the splitter 42 may be formed by only the connection point of inputs of the receivers $61_1$ to $61_3$. Detailed explanation thereof will be given later.

In the signal processor configured as described above, for example, 8-bit parallel data is supplied from the high-order application to each of the bit converters $11_1$ to $11_3$.

The bit converter $11_i$ converts the 8-bit parallel data from the high-order application into 10-bit parallel data and supplies the 10-bit parallel data to the P/S converter $12_i$.

The P/S converter $12_i$ converts the 10-bit parallel data from the bit converter 11 into serial data and supplies the serial data to the transmitter $51_i$.

The transmitter $51_i$ performs frequency conversion of the serial data, which is a baseband signal from the P/S converter $12_i$, into a converted signal having the frequency $fs_i$ as its center frequency and supplies the converted signal to the combiner 41 through a cable line.

The combiner 41 combines the converted signals output from the transmitters $51_1$ to $51_3$ and outputs the composite signal.

The composite signal output from the combiner 41 is transmitted to another signal processor by cable or wirelessly.

On the other hand, the composite signal transmitted by cable or wirelessly is supplied from another signal processor to the splitter 42.

The splitter 42 distributes at least a converted signal having the frequency $fr_i$ as its center frequency, which is included in the composite signal supplied thereto, to the receiver $61_j$.

The receiver $61_i$ performs frequency conversion of the converted signal, which is included in the signal from the splitter 42 and has the frequency $fr_i$ as its center frequency, into serial data, which is a baseband signal, and supplies the serial data to the S/P converter $25_i$ through the CDR $24_i$.

The S/P converter $25_i$ converts the serial data, which is supplied through the CDR $24_i$, into 10-bit parallel data, and supplies the 10-bit parallel data to the bit converter 27 through the word alignment section $26_i$.

The bit converter 27 converts the 10-bit parallel data, which is supplied through the word alignment section 26, into 8-bit parallel data, and supplies the 8-bit parallel data to the high-order application.

As described above, in the signal processor, serial data which is a baseband signal is frequency-converted into converted signals in different frequency bands by the plurality of (three) transmitters $51_1$ to $51_3$, and the converted signals output from the transmitters $51_1$ to $51_3$ are combined and the composite signal is output.

In addition, at least a converted signal in a frequency band, which is to be frequency-converted by the receiver $61_i$ and which is included in the composite signal transmitted from another signal processor, is distributed to the receiver $61_i$, and the converted signal in a frequency band to be frequency-converted by the receiver $61_i$ is frequency-converted into serial data, which is a baseband signal, by the receivers $61_1$ to $61_3$.

Therefore, high-speed data transmission can be performed easily.

That is, compared with the SERDES in FIG. 1, the signal processor shown in FIG. 2 has the plurality of (three) SERDES sections $31_1$ to $31_3$ as blocks which perform the same P/S conversion and S/P conversion as in the SERDES shown in FIG. 1. Accordingly, compared with the SERDES in FIG. 1, data can be processed three times without increasing the processing speed of the P/S converter 12, the CDR 24, and the S/P converter 25 which are blocks for processing the serial data (accordingly, without increasing the power consumption of each block which processes the serial data). Simply, it is possible to process data three times in the same period.

In addition, high-speed data transmission can be performed as in the signal processor shown in FIG. 2 simply by providing the three serializers 10 and the three de-serializers 20 in the SERDES shown in FIG. 1, for example.

However, for example, when the three serializers 10 and the three de-serializers 20 are provided in the SERDES shown in FIG. 1, the number of pads 14 and 21 is increased. Accordingly, it may be difficult to provide the three serializers 10 and the three de-serializers 20 depending on the restrictions, such as the number of wiring lines in a semiconductor chip as the SERDES or the number of pins of a semiconductor chip.

In contrast, in the signal processor shown in FIG. 2, serial data which is a baseband signal is frequency-converted into converted signals in different frequency bands by the three transmitters $51_1$ to $51_3$, the converted signals output from the transmitters $51_1$ to $51_3$ are combined by the combiner 41, and the composite signal is output.

Accordingly, the number of pads for outputting the composite signal is one no matter how many SERDES sections are provided. That is, the number of pads is not increased.

Moreover, in the signal processor shown in FIG. 2, the splitter 42 distributes to the receiver $61_i$ at least a converted signal in a frequency band which is to be frequency-converted by the receiver $61_i$ and is included in a composite signal, which is obtained by combining converted signals in different frequency bands and is transmitted from another signal processor, and each of the receivers $61_1$ to $61_3$ performs frequency conversion of the converted signal in a frequency band, which is to be frequency-converted by the receiver $61_i$, into serial data which is a baseband signal.

Accordingly, the number of pads for inputting (supplying) to the splitter 42 the composite signal transmitted from another signal processor is one no matter how many SERDES sections are provided. That is, the number of pads is not increased.

As described above, the number of pins of a semiconductor chip which is the signal processor shown in FIG. 2 is not increased no matter how many SERDES sections are provided.

In addition, in the signal processor shown in FIG. 2, the serial data which is a baseband signal is transmitted from each of the plurality of (three) transmitters $51_1$ to $51_3$ after being frequency-converted into converted signals in different frequency bands. Accordingly, compared with the case of transmitting the serial data by increasing the operation speed in the SERDES shown in FIG. 1, there is an advantage in that imperfections in transmission path characteristics (for example, the presence of a frequency with large or small attenuation in the transmission path) can be easily solved by adjusting the frequency band of a converted signal acquired by frequency conversion, for example.

Here, although the three SERDES sections $31_1$ to $31_3$ are provided in the signal processor in FIG. 2, two SERDES sections or four or more SERDES sections may also be provided in the signal processor.

In addition, transmission and reception of a composite signal between the signal processor shown in FIG. 2 and another signal processor may be performed either by cable or wirelessly. In the case of wireless transmission and reception, separate antennas (an antenna for transmission and an antenna for reception) may be used or one common antenna may be used for transmission and reception of a composite signal.

In addition, when transmission and reception of a composite signal between the signal processor shown in FIG. 2 and another signal processor are performed wirelessly, not only the air but also various kinds of waveguides, such as a dielectric waveguide, may be adopted as the wireless transmission path. An example of the dielectric waveguide is disclosed in JP-A-2010-103982.

In addition, although both the serializer $50_i$ and the de-serializer $60_i$ are provided in the SERDES section $31_i$ in FIG. 2, only the serializer $50_i$ or the de-serializer $60_i$ may be provided in the SERDES section $31_i$ when necessary.

When only the serializer $50_i$ is provided in the SERDES section $31_i$, the signal processor may be formed without the splitter 42. When only the de-serializer $60_i$ is provided in the SERDES section $31_i$, the signal processor may be formed without the combiner 41.

<Examples of the Configuration of the Transmitter 51 and the Receiver 61>

Figure 3:
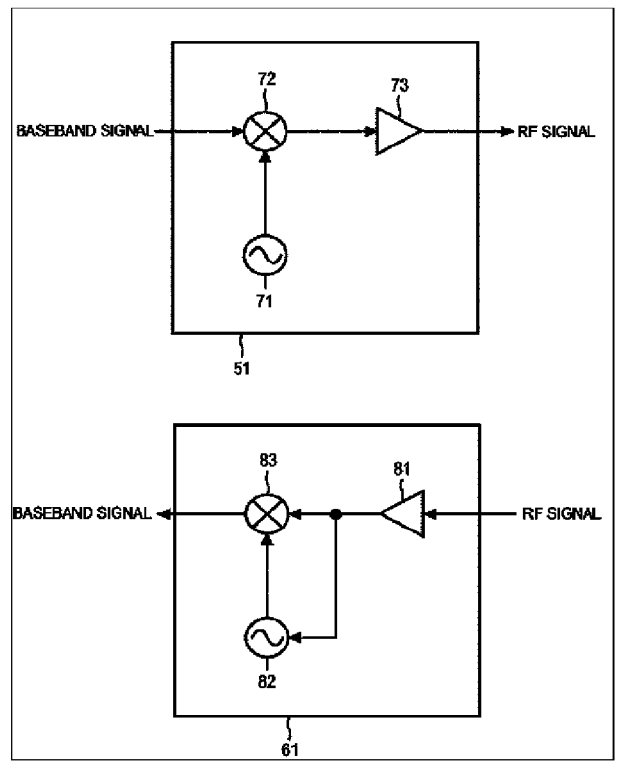
FIG. 3 is a block diagram showing examples of the configuration of a transmitter 51 and a receiver 61.

FIG. 3 is a block diagram showing examples of the configuration of the transmitter 51 and the receiver 61 shown in FIG. 2.

The transmitter 51 and the receiver 61 perform frequency conversion between a baseband signal and a signal in a millimeter wave band, for example.

In addition, the signal in a millimeter wave band is a signal with a frequency of about 30 to 300 GHz, that is, a signal with a wavelength of about 1 to 10 mm. Since the signal in a millimeter wave band has a high frequency, high-speed data transmission becomes possible. In addition, in the case of wireless transmission and reception, an about 1 mm bonding wire can be adopted as an antenna, for example.

The transmitter 51 has an oscillator 71, a mixer 72, and amplifier 73.

Hereinafter, the oscillator 71, the mixer 72, and amplifier 73 provided in the transmitter 51$i$ are appropriately written as an oscillator 71$_i$, a mixer 72$_i$, and an amplifier 73$_i$, respectively.

The oscillator 71 generates a carrier in a millimeter wave band, for example, by oscillation and supplies it to the mixer 72.

The center frequencies $fs_1$ to $fs_3$ of the converted signals output from the transmitters 51$_1$ to 51$_3$ correspond to frequencies of carriers generated by the oscillators 71$_1$ to 71$_3$ provided in the transmitters 51$_1$ to 51$_3$, respectively.

Therefore, the frequencies of the carriers generated by the oscillators 71$_1$ to 71$_3$ are different.

To the mixer 72, a carrier is supplied from the oscillator 71 and serial data which is a baseband signal is supplied from the P/S converter 12 (FIG. 2).

Here, assuming that the data rate of the serial data supplied to the mixer 72 is about 2.5 to 5.0 Gbps, for example, it is preferable to set the frequency of the carrier generated by the oscillator 71 to 30 GHz or more, for example, in order that interference between converted signals, which are obtained by frequency conversion of such serial data in the transmitters 51$_1$ to 51$_3$, can be reduced and each converted signal can be separated from a composite signal obtained by combining the converted signals.

The mixer 72 mixes the serial data and the carrier from the oscillator 71 (multiplies the carrier from the oscillator 71 by the serial data) to modulate the carrier from the oscillator 71 according to the serial data and supplies to the amplifier 73 a modulated signal obtained as the result, that is, a converted signal obtained by frequency conversion of the serial data, which is a baseband signal, into an RF (Radio Frequency) signal in a frequency band corresponding to the carrier from the oscillator 71.

The amplifier 73 amplifies the RF signal as a converted signal from the mixer 72 and outputs the RF signal as a converted signal after the amplification.

The converted signal output from the amplifier 73 is supplied to the combiner 41. The combiner 41 combines the RF signals as converted signals output from the amplifier 73$_1$ to 73$_3$.

On the other hand, the receiver 61 has an amplifier 81, an oscillator 82, and a mixer 83.

Hereinafter, the amplifier 81, the oscillator 82, and the mixer 83 provided in the receiver 61$_i$ are appropriately written as an amplifier 81$_i$, an oscillator 82$_i$, and a mixer 83$_i$, respectively.

At least an RF signal including a converted signal in a frequency band, which is to be frequency-converted by the receiver 61$_i$, of the composite signal transmitted from another signal processor is supplied to the amplifier 81$_i$.

The amplifier 81 amplifies the RF signal supplied thereto and supplies to the oscillator 82 and the mixer 83 an RF signal which is obtained by the amplification and which is a converted signal in a frequency band to be frequency-converted by the receiver 61$_i$.

The oscillator 82 operates with the converted signal (RF signal) from the amplifier 81 as an input signal. The oscillator 82 generates by oscillation a reproduction carrier synchronized with the converted signal (carrier) as an input signal, that is, a reproduction carrier corresponding to the carrier used for frequency conversion into the converted signal and supplies the reproduction carrier to the mixer 83.

The mixer 83 mixes the converted signal from the amplifier 81 and the reproduction carrier from the oscillator 82 (multiplies the converted signal from the amplifier 81 by the reproduction carrier from the oscillator 82) to demodulate the converted signal (modulated signal) and supplies to the CDR 24 a modulated signal obtained as the result, that is, serial data obtained by frequency conversion of the converted signal into a baseband signal (FIG. 2).

<Examples of the Configuration of the Amplifiers 73 and 81>

Figure 4:
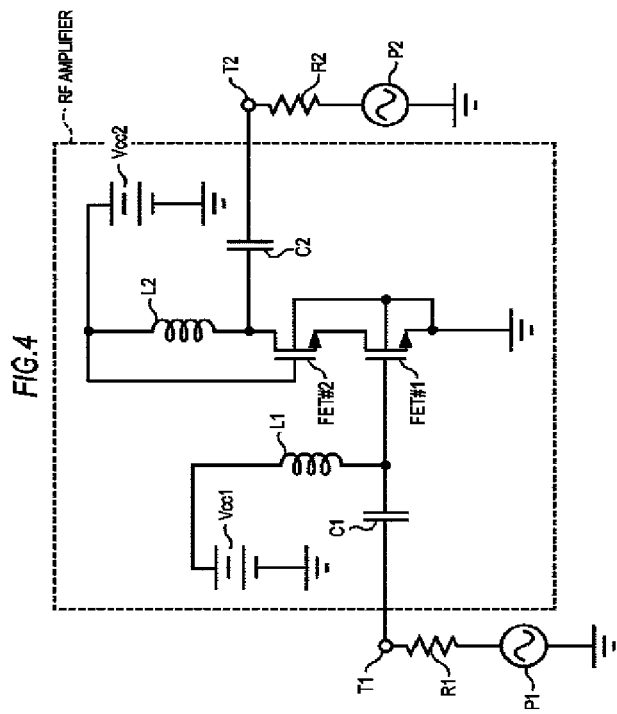
FIG. 4 is a circuit diagram showing an example of the configuration of an RF amplifier which can be adopted as amplifiers 73 and 81.

FIG. 4 is a circuit diagram showing an example of the configuration of an RF amplifier which can be adopted as the amplifiers 73 and 81 in FIG. 3.

The amplifiers 73 and 81 can be similarly formed since they are RF amplifiers which amplify an RF signal.

In FIG. 4, one end of a capacitor C1 is connected to an input terminal T1 of an RF amplifier, and the other end of the capacitor C1 is connected to one end of a coil L1. The other end of the coil L1 is connected to a positive terminal of a DC power supply Vcc1 whose negative terminal is grounded.

A connection point between the capacitor C1 and the coil L1 is connected to a gate of a FET (MOS FET) #1 whose source is grounded.

A drain of the FET#1 is connected to a source of an FET (MOS FET) #2, and a gate and a drain of the FET#2 are connected to one end and the other end of a coil L2, respectively.

In addition, substrates of the FET#1 and the FET#2 are grounded.

A connection point between the gate of the FET#2 and the coil L2 is connected to a positive terminal of a DC power supply Vcc2 whose negative terminal is grounded.

A connection point between the drain of the FET#2 and the coil L2 is connected to one end of a capacitor C2, and the other end of the capacitor C2 is connected to an output terminal T2 of the RF amplifier.

The RF amplifier shown in FIG. 4 can be used in cascade connection. Accordingly, each of the amplifiers 73 and 81 may be formed by only one RF amplifier shown in FIG. 4 or by cascade connection of a plurality of RF amplifiers shown in FIG. 4 which are necessary.

In addition, when the amplifier 73 or 81 is formed by only one RF amplifier shown in FIG. 4, the other ends of resistors R1 and R2 each of which has grounded one end are connected to the input terminal T1 and the output terminal T2, respectively.

In addition, when the amplifier 73 or 81 is formed by cascade connection of a plurality of RF amplifiers shown in FIG. 4, the other ends of the resistors R1 and R2 each of which has grounded one end are connected to the input terminal T1 of the first RF amplifier and the output terminal T2 of the last RF amplifier, respectively.

Hereinafter, it is assumed that each of the amplifiers 73 and 81 is formed by only one RF amplifier shown in FIG. 4 for convenience of explanation.

Since the amplifier 73 or 81 amplifies an RF signal in a millimeter wave band which is a high-frequency signal, an inductance load may be used as an input-side or output-side load of an RF amplifier as such an amplifier 73 or 81.

In the millimeter wave band, a coil with small inductance can be adopted as the inductance load, and such a coil can be easily formed on the CMOS.

In the RF amplifier shown in FIG. 4, the coil L1 is an inductance load at the input side and the coil L2 is an inductance load at the output side.

When the inductance load is adopted as an input-side load of the RF amplifier, the frequency characteristics at the input side of the RF amplifier become band pass type characteristics, such as a BPF. Accordingly, it is possible to separate a signal in a part of the frequency band from RF signals input (supplied) to the RF amplifier and to amplify the signal.

In addition, when the inductance load is adopted as an output-side load of the RF amplifier, the frequency characteristics at the output side of the RF amplifier become band pass type characteristics, such as a BPF. Accordingly, it is possible to restrict the frequency band of the RF signal output from the RF amplifier.

As described above, the frequency characteristics at the input side or the output side become band pass type characteristics by adopting the RF amplifier, of which a load at the input side or the output side is an inductance load, as the amplifier 73 or 81 shown in FIG. 3. For this reason, the combiner 41 or the splitter 42 can be simply formed by only the connection point, which makes a connection between connection lines, without a BPF as described above in FIG. 2.

In addition, if an RF amplifier as the amplifier 73 of the transmitter 51 connected to the combiner 41 is formed such that at least the frequency characteristics at the output side of the frequency characteristics at the input and output sides become band pass type characteristics, the combiner 41 can be formed without a BPF.

Accordingly, as the input-side load in the RF amplifier as the amplifier 73 of the transmitter 51 connected to the combiner 41, a load which is not an inductance load can be adopted, that is, a resistor can be used instead of the coil L1.

In addition, if an RF amplifier as the amplifier 81 of the receiver 61 connected to the combiner 42 is formed such that at least the frequency characteristics at the input side of the frequency characteristics at the input and output sides become band pass type characteristics, the splitter 42 can be formed without a BPF.

Accordingly, as the output-side load in the RF amplifier as the amplifier 81 of the receiver 61 connected to the splitter 42, a load which is not an inductance load can be adopted, that is, a resistor can be used instead of the coil L2.

In the RF amplifier as the amplifier 81 of the receiver 61, however, it is preferable to adopt the inductance load as the output-side load instead of a resistor when a gain equal to or larger than a predetermined value is necessary.

Moreover, in the RF amplifier shown in FIG. 4, a transfer coefficient S12 from the output terminal T2 to the input terminal T1 among S parameters (scattering parameters) becomes a small value.

<Converter 41 and Splitter 42>

Next, forming the combiner 41 and the splitter 42 by only the connection point, which makes a connection between connection lines, without a BPF by adopting the RF amplifier in FIG. 4 as the amplifiers 73 and 81 in FIG. 3 will be described.

In addition, the following explanation will be given focusing on the two transmitters 51$_1$ and 51$_2$ of the three transmitters 51$_1$ to 51$_3$ for convenience of explanation.

In addition, it is assumed that the transmitter 51$_1$ performs frequency conversion of a baseband signal into an RF signal as a converted signal in a frequency band having a center frequency fs$_1$ of 60 GHz (hereinafter, also referred to as a 60 G band signal) and the transmitter 51$_2$ performs frequency conversion of a baseband signal into an RF signal as a converted signal in a frequency band having a center frequency fs$_1$ of 80 GHz (hereinafter, also referred to as an 80 G band signal) which is different from 60 GHz.

Similarly, also in the three receivers 61$_1$ to 61$_3$, the explanation is given focusing on the two receivers 61$_1$ and 61$_2$. It is assumed that the receiver 61$_1$ performs frequency conversion of the 60 G band signal into a baseband signal and the receiver 61$_2$ performs frequency conversion of the 80 G band signal into a baseband signal.

In this case, although the amplifier 73$_1$ of the transmitter 51$_1$ amplifies a 60 G band signal and the amplifier 73$_2$ of the transmitter 51$_2$ amplifies an 80 G band signal, the amplifier 73$_1$ of the transmitter 51$_1$ and the amplifier 73$_2$ of the transmitter 51$_2$ are different from an RF amplifier as the amplifier 73$_1$ which amplifies a 60 G band signal and an RF amplifier as the amplifier 73$_2$ which amplifies an 80 G band signal only in the inductances of the coils L1 and L2.

That is, a coil with an inductance suitable for amplifying the 60 G band signal is adopted as the coils L1 and L2 of the RF amplifier as the amplifier 73$_1$ which amplifies the 60 G band signal, and a coil with an inductance suitable for amplifying the 80 G band signal is adopted as the coils L1 and L2 of the RF amplifier as the amplifier 73$_2$ which amplifies the 80 G band signal.

The same is true for the amplifier 81$_1$ of the receiver 61$_1$ and the amplifier 81$_2$ of the receiver 61$_2$.

Hereinafter, the RF amplifier as the amplifier 73$_1$ which amplifies the 60 G band signal is also called a 60 G transmission amplifier, and the RF amplifier as the amplifier 73$_2$ which amplifies the 80 G band signal is also called an 80 G transmission amplifier.

Similarly, the RF amplifier as the amplifier 81$_1$ which amplifies the 60 G band signal is also called a 60 G receiving amplifier, and the RF amplifier as the amplifier 81$_2$ which amplifies the 80 G band signal is also called an 80 G receiving amplifier.

Moreover, hereafter, the 60 G transmission amplifier and the 60 G receiving amplifier are also called a 60 G amplifier collectively, and the 80 G transmission amplifier and the 80 G receiving amplifier are also called an 80 G amplifier collectively.

FIGS. 5, 6, 7 and 8 are views showing simulation results of the simulation for measuring various kinds of parameters of the 60 G amplifier and the 80 G amplifier.

Moreover, in the simulation, as shown in FIG. 4, a series circuit of the resistor R1 and an AC power supply P1 were connected to the input terminal T1 and a series circuit of the resistor R2 and an AC power supply P2 were connected to the output terminal T2 and various kinds of parameters of the 60 G amplifier and the 80 G amplifier were measured while changing the frequencies of the AC power supplies P1 and P2 when necessary.

Figure 5:
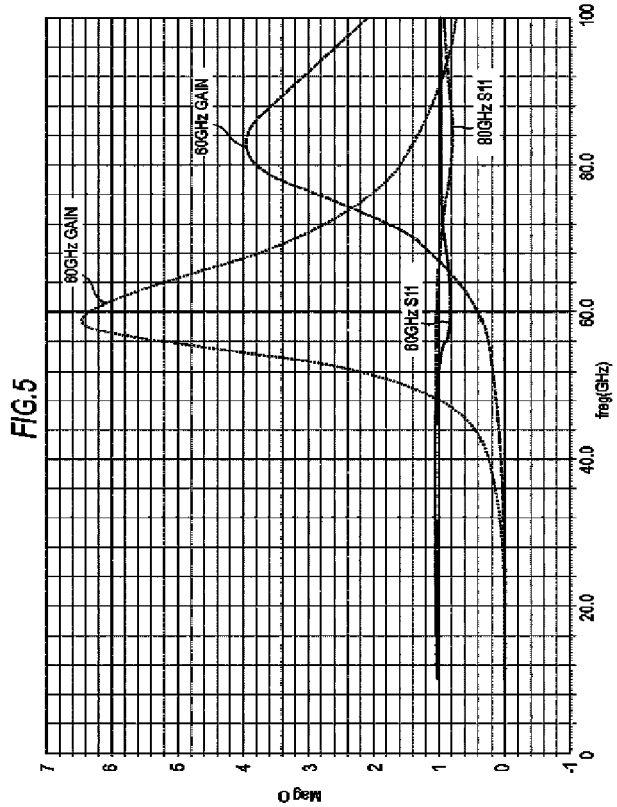
FIG. 5 is a view showing an amplitude characteristic (60 GHz Gain) of a 60 G amplifier and the size (60 GHz S11) of a reflection coefficient S11 at the input terminal T1 side and an amplitude characteristic (80 GHz Gain) of an 80 G amplifier and the size (80 GHz S11) of the reflection coefficient S11 at the input terminal T1 side.

FIG. 5 shows an amplitude characteristic (60 GHz Gain) of the 60 G amplifier and the size (absolute value) (60 GHz S11) of a reflection coefficient S11 at the input terminal T1 side and an amplitude characteristic (80 GHz Gain) of the 80 G amplifier and the size (80 GHz S11) of the reflection coefficient S11 at the input terminal T1 side.

The isolation between the amplitude characteristic of the 60 G amplifier and the amplitude characteristic of the 80 G amplifier is preferably set such that each of the 60 G band signal after amplification in the 60 G amplifier and the 80 G band signal after amplification in the 80 G amplifier can be received at the receiving side when the 60 G band signal after amplification and the 80 G band signal after amplification are transmitted through the transmission path after frequency multiplexing.

Figure 6:
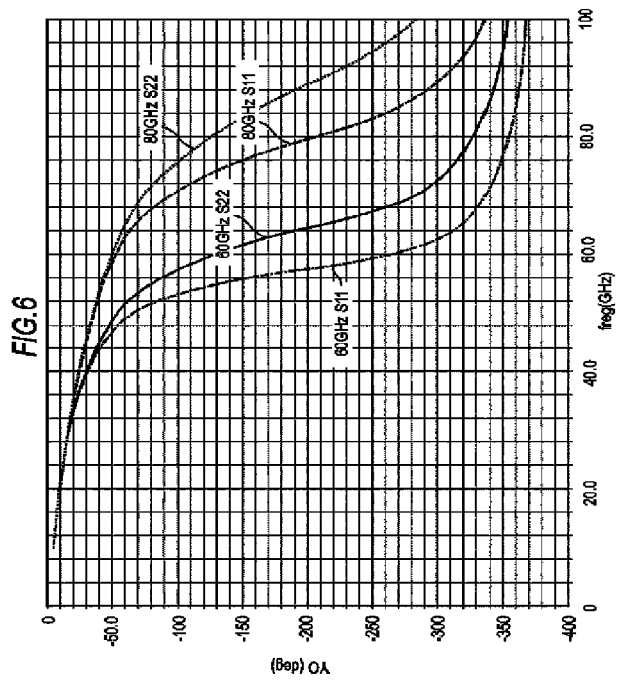
FIG. 6 is a view showing a phase (60 GHz S11) of the reflection coefficient S11 at the input terminal T1 side of the 60 G amplifier and a phase (60 GHz S22) of the reflection coefficient S22 at the output terminal T2 side and a phase (80 GHz S11) of the reflection coefficient S11 at the input terminal T1 side of the 80 G amplifier and a phase (80 GHz S22) of the reflection coefficient S22 at the output terminal T2 side.

FIG. 6 shows a phase (60 GHz S11) of a reflection coefficient S11 at the input terminal T1 side of the 60 G amplifier and a phase (60 GHz S22) of a reflection coefficient S22 at the output terminal T2 side and a phase (80 GHz S11) of the reflection coefficient S11 at the input terminal T1 side of the 80 G amplifier and a phase (80 GHz S22) of the reflection coefficient S22 at the output terminal T2 side.

Figure 7:
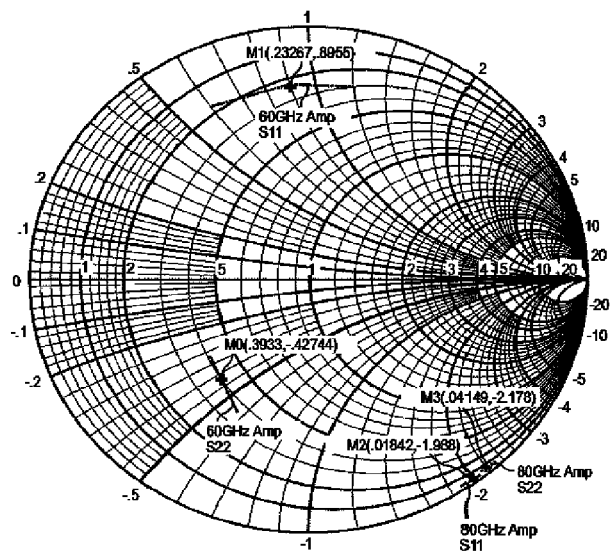
FIG. 7 is a smith chart showing each locus of the reflection coefficient S11 (60 GHz Amp S11) and the reflection coefficient S22 (60 GHz Amp S22) of the 60 G amplifier and each locus of the reflection coefficient S11 (80 GHz Amp S11) and the reflection coefficient S22 (80 GHz Amp S22) of the 80 G amplifier.

FIG. 7 is a smith chart showing each locus of the reflection coefficient S11 (60 GHz Amp S11) and the reflection coefficient S22 (60 GHz Amp S22) of the 60 G amplifier and each locus of the reflection coefficient S11 (80 GHz Amp S11) and the reflection coefficient S22 (80 GHz Amp S22) of the 80 G amplifier, which are measured while changing the frequencies of the AC power supplies P1 and P2 from 59 GHz to 61 GHz.

According to FIG. 7, the sizes (absolute values) of the reflection coefficients S11 and S12 of the 80 G amplifier for the signals of 59 GHz to 61 GHz are close to 1.0. Therefore, the signals of 59 GHz to 61 GHz, that is, 60 G band signals are almost reflected at the input and output sides of the 80 G amplifier.

Figure 8:
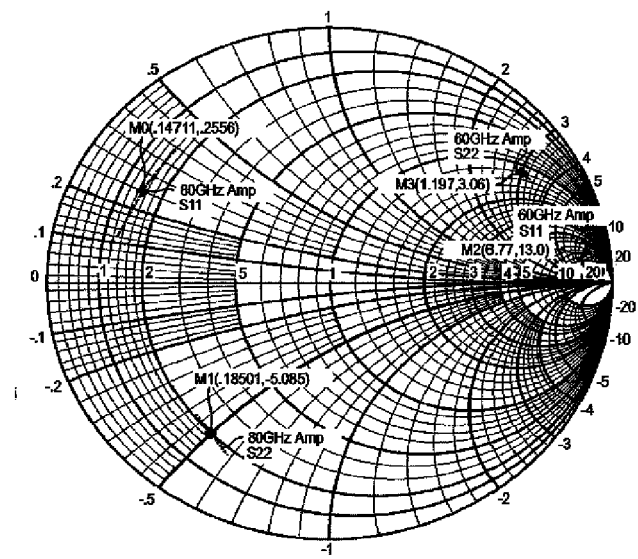
FIG. 8 is a smith chart showing each locus of the reflection coefficient S11 (60 GHz Amp S11) and the reflection coefficient S22 (60 GHz Amp S22) of the 60 G amplifier and each locus of the reflection coefficient S11 (80 GHz Amp S11) and the reflection coefficient S22 (80 GHz Amp S22) of the 80 G amplifier.

FIG. 8 is a smith chart showing each locus of the reflection coefficient S11 (60 GHz Amp S11) and the reflection coefficient S22 (60 GHz Amp S22) of the 60 G amplifier and each locus of the reflection coefficient S11 (80 GHz Amp S11) and the reflection coefficient S22 (80 GHz Amp S22) of the 80 G amplifier, which are measured while changing the frequencies of the AC power supplies P1 and P2 from 79 GHz to 81 GHz.

According to FIG. 8, the sizes (absolute values) of the reflection coefficients S11 and S12 of the 60 G amplifier for the signals of 79 GHz to 81 GHz are sufficiently large although they are not as large as the reflection coefficients S11 and S12 of the 80 G amplifier shown in FIG. 7. Therefore, the signals of 79 GHz to 81 GHz, that is, 80 G band signals are sufficiently reflected at the input and output sides of the 60 G amplifier.

As described above, since the frequency characteristics at the input and output sides of the 60 G amplifier and the 80 G amplifier become band pass type characteristics, 80 G band signals are reflected at the input and output sides of the 60 G amplifier and 60 G band signals are reflected at the input and output sides of the 80 G amplifier.

Accordingly, when connection lines of outputs of the 60 G transmission amplifier and the 80 G transmission amplifier are simply connected to each other, the 60 G band signal output from the 60 G transmission amplifier is reflected at the output side of the 80 G transmission amplifier and the 80 G band signal output from the 80 G transmission amplifier is reflected at the output side of the 60 G transmission amplifier. For this reason, combination of the 60 G band signal output from the 60 G transmission amplifier and the 80 G band signal output from the 80 G transmission amplifier can be performed just by connecting the connection lines of the outputs of the 60 G transmission amplifier and the 80 G transmission amplifier.

In addition, when a composite signal obtained by combining the 60 G band signal and the 80 G band signal is given to the connection point at which connection lines of inputs of the 60 G receiving amplifier and the 80 G receiving amplifier are simply connected to each other, the 80 G band signal included in the composite signal is reflected at the input side of the 60 G receiving amplifier and the 60 G band signal included in the composite signal is reflected at the input side of the 80 G receiving amplifier. Accordingly, distribution of the 60 G band signal included in the composite signal to the 60 G receiving amplifier and distribution of the 80 G band signal included in the composite signal to the 80 G receiving amplifier can be performed just by connecting the connection lines of the inputs of the 60 G receiving amplifier and the 80 G receiving amplifier.

That is, the combiner 41 which combines the 60 G band signal output from the 60 G transmission amplifier with the 80 G band signal output from the 80 G transmission amplifier may be formed by only the connection point, which makes a connection between the connection lines of the outputs of the 60 G transmission amplifier and the 80 G transmission amplifier, without a BPF.

In addition, the splitter 42 which distributes the 60 G band signal and the 80 G band signal included in the composite signal may be formed by only the connection point, which makes a connection between the connection lines of the inputs of the 60 G transmission amplifier and the 80 G transmission amplifier, without a BPF.

As described above, by adopting the RF amplifier shown in FIG. 4 as the amplifier 73 of the transmitter 51 and the amplifier 81 of the receiver 61 shown in FIG. 3, the combiner 41 can be formed by only the connection point, which makes a connection between the connection lines of the outputs of the transmitters $51_1$ to $51_3$, without a BPF and the splitter 42 can be formed by only the connection point, which makes a connection between the connection lines of the inputs of the receivers $61_1$ to $61_3$, without a BPF.

The SERDES sections $31_1$ to $31_3$, the combiner 41, and the splitter 42 which form the signal processor shown in FIG. 2 can be formed on a one-chip semiconductor chip, such as a CMOS, with small sizes by forming the combiner 41 and the splitter 42 with only the connection point which makes a connection between the connection lines.

Figure 9:
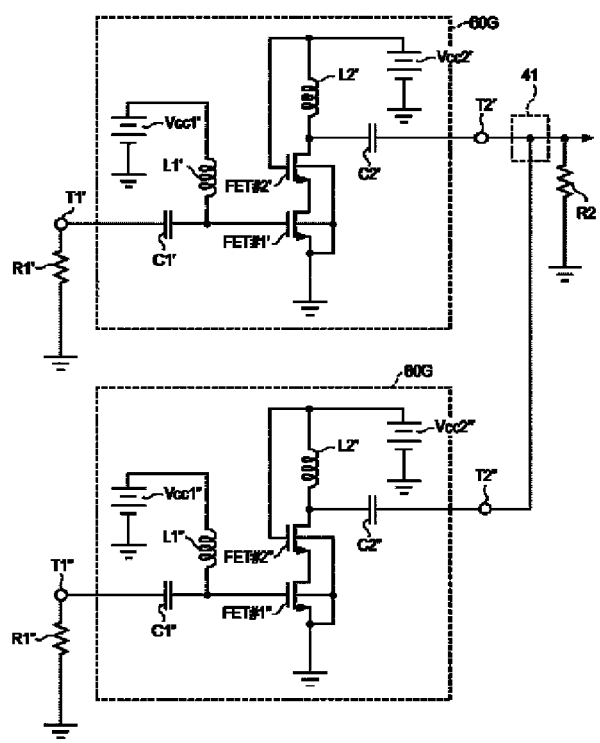
FIG. 9 is a circuit diagram showing an example of the configuration of a combiner 41 formed by only a connection point which makes a connection between connection lines of outputs of a 60 G transmission amplifier and an 80 G transmission amplifier.

FIG. 9 is a circuit diagram showing an example of the configuration of the combiner 41 formed by only a connection point which makes a connection between connection lines of the outputs of the 60 G transmission amplifier and the 80 G transmission amplifier.

Moreover, in FIG. 9, reference numerals obtained by adding prime (') to the reference numerals given to the components of the RF amplifier shown in FIG. 4 are given to components of the 60 G transmission amplifier corresponding to the components of the RF amplifier shown in FIG. 4, and reference numerals obtained by adding double prime (") to the reference numerals given to the components of the RF amplifier shown in FIG. 4 are given to components of the 80 G transmission amplifier corresponding to the components of the RF amplifier shown in FIG. 4.

In FIG. 9, the combiner 41 is formed by only the connection point which makes a connection between the connection lines of the outputs of the 60 G transmission amplifier and the 80 G transmission amplifier.

Figure 10:
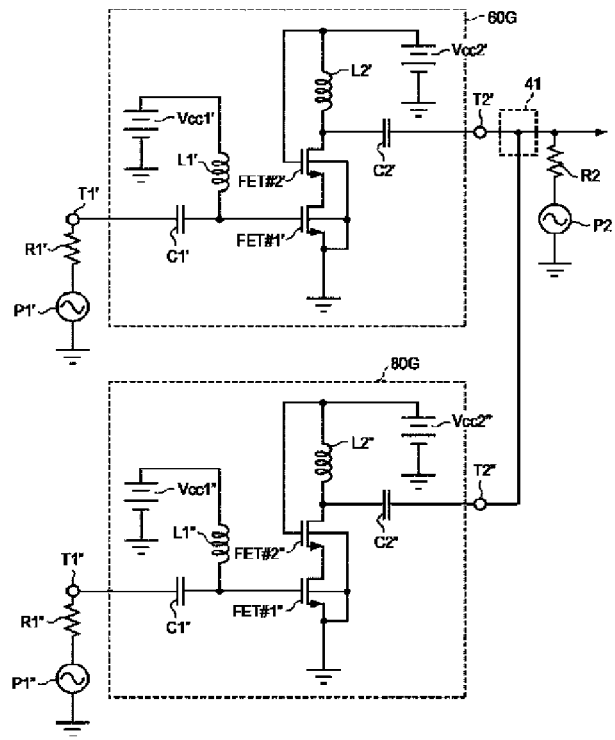
FIG. 10 is a circuit diagram showing a circuit used in the simulation for measuring parameters of the 60 G transmission amplifier and the 80 G transmission amplifier, which is performed for the combiner 41 formed by only a connection point which makes a connection between the connection lines of the outputs of the 60 G transmission amplifier and the 80 G transmission amplifier.

FIG. 10 is a circuit diagram showing a circuit used in the simulation for measuring various kinds of parameters of the 60 G transmission amplifier and the 80 G transmission amplifier, which is performed for the combiner 41 (FIG. 9) formed by only the connection point which makes a connection between the connection lines of the outputs of the 60 G transmission amplifier and the 80 G transmission amplifier.

In FIG. 10, AC power supplies P1', P1", and P2 for measuring the parameters are connected to the circuit shown in FIG. 9.

Figure 11:
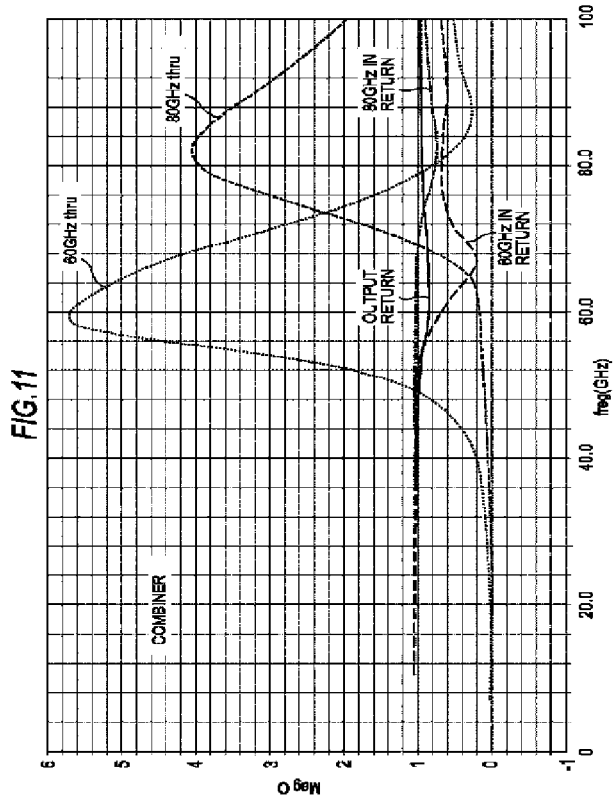
FIG. 11 is a view showing the amplitude characteristics of the 60 G transmission amplifier, the 80 G transmission amplifier, and the combiner 41.
Figure 12:
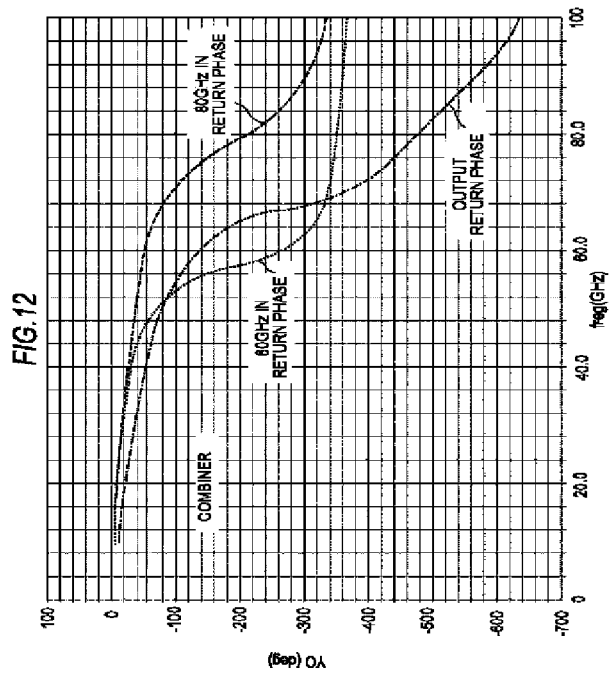
FIG. 12 is a view showing the phase characteristics of the 60 G transmission amplifier, the 80 G transmission amplifier, and the combiner 41.

FIGS. 11 and 12 are views showing simulation results of the simulation for measuring various kinds of parameters of the 60 G transmission amplifier and the 80 G transmission amplifier, which was performed using the circuit shown in FIG. 10 for the combiner 41 (FIG. 9) formed by only the connection point which makes a connection between the connection lines of the outputs of the 60 G transmission amplifier and the 80 G transmission amplifier.

That is, FIG. 11 shows an amplitude characteristic (60 GHz thru) of a signal transmitted through (passing through) the 60 G transmission amplifier, an amplitude characteristic (80 GHz thru) of a signal transmitted through the 80 G transmission amplifier, an amplitude characteristic (60 GHz in return) of a signal reflected at the input side of the 60 G transmission amplifier, an amplitude characteristic (80 GHz in return) of a signal reflected at the input side of the 80 G transmission amplifier, and an amplitude characteristic (output return) of a signal reflected from the output side of the combiner 41 (to the 60 G transmission amplifier side and the 80 G transmission amplifier side).

FIG. 12 shows a phase characteristic (60 GHz in return phase) of a signal reflected at the input side of the 60 G transmission amplifier, a phase characteristic (80 GHz in return phase) of a signal reflected at the input side of the 80 G transmission amplifier, and a phase characteristic (output return phase) of a signal reflected from the output side of the combiner 41.

Figure 13:
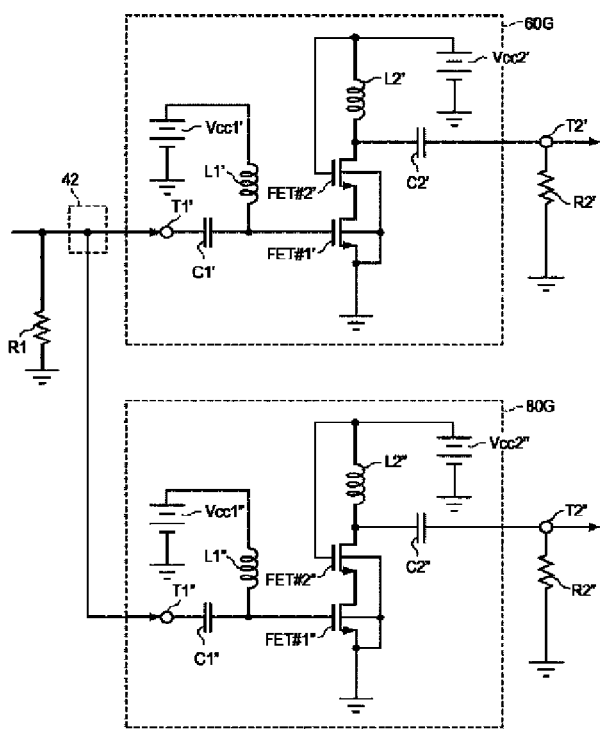
FIG. 13 is a circuit diagram showing an example of the configuration of a splitter 42 formed by only a connection point which makes a connection between connection lines of the inputs of the 60 G receiving amplifier and the 80 G receiving amplifier.

FIG. 13 is a circuit diagram showing an example of the configuration of the splitter 42 formed by only a connection point which makes a connection between connection lines of the inputs of the 60 G receiving amplifier and the 80 G receiving amplifier.

Moreover, in FIG. 13, reference numerals obtained by adding prime (') to the reference numerals given to the components of the RF amplifier shown in FIG. 4 are given to components of the 60 G receiving amplifier corresponding to the components of the RF amplifier shown in FIG. 4, and reference numerals obtained by adding double prime (") to the reference numerals given to the components of the RF amplifier shown in FIG. 4 are given to components of the 80 G receiving amplifier corresponding to the components of the RF amplifier shown in FIG. 4.

In FIG. 13, the splitter 42 is formed by only the connection point which makes a connection between the connection lines of the inputs of the 60 G receiving amplifier and the 80 G receiving amplifier.

Figure 14:
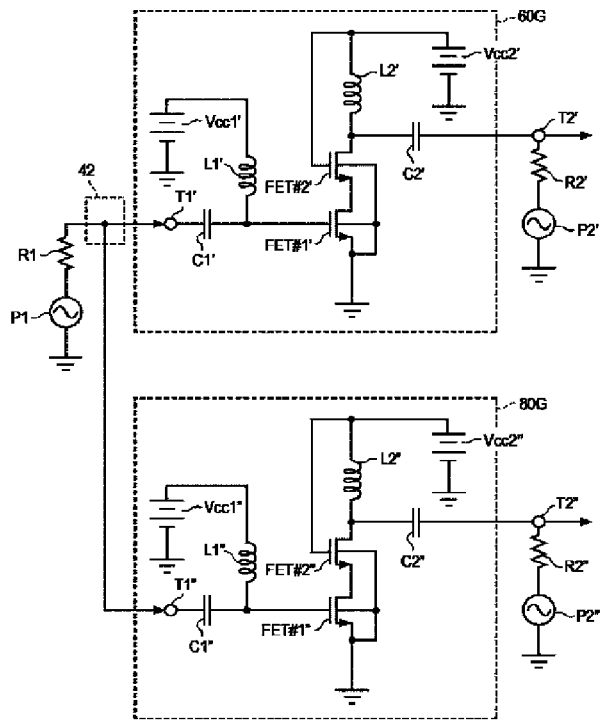
FIG. 14 is a circuit diagram showing a circuit used in the simulation for measuring parameters of the 60 G receiving amplifier and the 80 G receiving amplifier, which is performed for the splitter 42 formed by only a connection point which makes a connection between the connection lines of the inputs of the 60 G receiving amplifier and the 80 G receiving amplifier.

FIG. 14 is a circuit diagram showing a circuit used in the simulation for measuring various kinds of parameters of the 60 G receiving amplifier and the 80 G receiving amplifier, which is performed for the splitter 42 (FIG. 13) formed by only the connection point which makes a connection between the connection lines of the inputs of the 60 G receiving amplifier and the 80 G receiving amplifier.

In FIG. 14, AC power supplies P1, P2', and P2" for measuring the parameters are connected to the circuit shown in FIG. 13.

Figure 15:
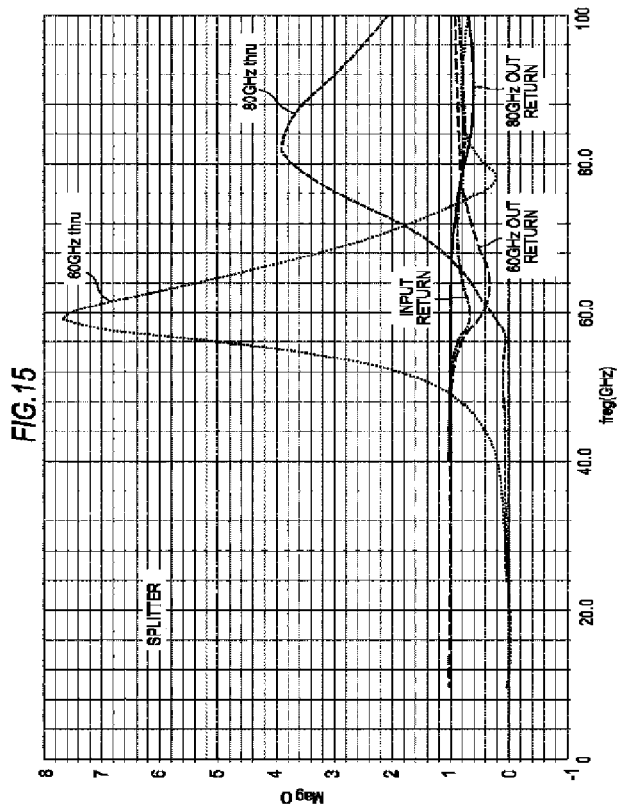
FIG. 15 is a view showing the amplitude characteristics of the 60 G receiving amplifier, the 80 G receiving amplifier, and the splitter 42.

FIGS. 15 and 16 are views showing simulation results of the simulation for measuring various kinds of parameters of the 60 G receiving amplifier and the 80 G receiving amplifier, which was performed using the circuit shown in FIG. 14 for the splitter 42 (FIG. 13) formed by only the connection point which makes a connection between the connection lines of the inputs of the 60 G receiving amplifier and the 80 G receiving amplifier.

That is, FIG. 15 shows an amplitude characteristic (60 GHz thru) of a signal transmitted through (passing through) the 60 G receiving amplifier, an amplitude characteristic (80 GHz thru) of a signal transmitted through the 80 G receiving amplifier, an amplitude characteristic (60 GHz out return) of a signal reflected at the output side of the 60 G receiving amplifier, an amplitude characteristic (80 GHz out return) of a signal reflected at the output side of the 80 G receiving amplifier, and an amplitude characteristic (input return) of a signal reflected at the input side of the splitter 42.

FIG. 16 shows a phase characteristic (60 GHz out return phase) of a signal reflected at the output side of the 60 G receiving amplifier, a phase characteristic (80 GHz out return phase) of a signal reflected at the output side of the 80 G receiving amplifier, and a phase characteristic (input return phase) of a signal reflected at the input side of the splitter 42.

In addition, embodiments of the present disclosure are not limited to the embodiments described above, and various changes may be made without departing from the scope of the present disclosure.

That is, although the case where the present disclosure is applied to the signal processor, which is a one-chip semiconductor chip functioning as the SERDES, has been described in the present embodiment, the present disclosure may also be applied to semiconductor chips other than the SERDES.

The present disclosure contains subject matter related to that disclosed in Japanese Priority Patent Application JP 2011-032340 filed in the Japan Patent Office on Feb. 17, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10: serializer
11: bit converter
12: P/S converter
13: driver
14: pad
20: de-serializer
21: pad
22: receiver
23: equalizer
24: CDR
25: S/P converter
26: word alignment section
27: bit converter
$31_2$, $31_2$, $31_3$: SERDES section
41: combiner
42: splitter
50: serializer
51: transmitter
60: de-serializer
61: receiver
71: oscillator
72: mixer
73, 81: amplifier
82: oscillator
83: mixer

The invention claimed is:
1. A signal processor comprising:
a plurality of frequency converters which frequency convert input signals and output converted signals; and
an output section which combines the converted signals output from the plurality of frequency converters and outputs a composite signal,
wherein,
the plurality of frequency converters are formed in a one-chip semiconductor chip, the plurality of frequency converters perform frequency conversion into converted signals in different frequency bands,
a plurality of P/S converters which convert parallel data into serial data are further formed in the semiconductor chip, and
one of the frequency converters frequency converts serial data which is a baseband signal output from one of the P/S converters.

2. The signal processor according to claim 1, wherein each of the frequency converters performs frequency conversion of a signal in a predetermined frequency band as the input signal and outputs a converted signal in a higher frequency band than the predetermined frequency band.

3. The signal processor according to claim 2, wherein a combining section which combines the converted signals and outputs the composite signal is also in the semiconductor chip.

4. The signal processor according to claim 3, wherein the combining section is a connection point which makes a connection between connection lines of outputs of the plurality of frequency converters.

5. The signal processor according to claim 4, wherein:
each of the frequency converters has an amplifier which amplifies the converted signal, and
the amplifier has an inductance load at least at an output side of input and output sides.

6. The signal processor according to claim 2, wherein the composite signal is transmitted wirelessly.

7. The signal processor according to claim 6, wherein the composite signal is transmitted through a dielectric waveguide.

8. The signal processor according to claim 2, wherein at least one of the frequency converters frequency converts a baseband signal into one of the converted signals in a frequency band equal to or higher than 30 GHz.

9. A signal processing method comprising:
providing a signal processor comprised of a plurality of frequency converters and an output section;
performing frequency conversion into converted signals in different frequency bands by means of the signal processor frequency converters which frequency convert input signals to output converted signals;
outputting the converted signals after performing the frequency conversion of the input signals; and
combining in the output section the converted signals output from the plurality of frequency converters and outputting a composite signal,
wherein
the plurality of frequency converters are in a one-chip semiconductor chip,
a plurality of P/S converters which convert parallel data into serial data are also in the semiconductor chip, and
one of the frequency converters frequency converts serial data which is a baseband signal output from one of the P/S converters.

10. A signal processor comprising:
a plurality of frequency converters which frequency convert previously converted signals obtained by performing frequency conversion of input signals, and output the input signals,
wherein,
the plurality of frequency converters are formed in a one-chip semiconductor chip,
the plurality of frequency converters perform frequency conversion of converted signals in different frequency bands,
to each of the plurality of frequency converters, at least a converted signal in a frequency band to be frequency-converted by the frequency converter, of a composite signal obtained by combining a plurality of converted signals in different frequency bands, is distributed,
a plurality of S/P converters which convert serial data into parallel data are also in the semiconductor chip, and
one of the frequency converters frequency converts a converted signal in a frequency band, which is to be frequency-converted by the frequency converter, into serial data which is a baseband signal, and supplies the frequency-converted serial data to one of the S/P converters.

11. The signal processor according to claim 10, wherein each of the frequency converters performs frequency conversion of a converted signal which is a signal in a higher frequency band than a predetermined frequency band and outputs a signal in the predetermined frequency band.

12. The signal processor according to claim 11, wherein a distribution section which distributes to each of the plurality of frequency converters at least a converted signal in a frequency band to be frequency-converted by the frequency converter is further also in the semiconductor chip.

13. The signal processor according to claim 12, wherein the distribution section is a connection point which makes a connection between connection lines of inputs of the plurality of frequency converters.

14. The signal processor according to claim 13, wherein:
each of the frequency converters has an amplifier which amplifies a signal input to the frequency converter, and
the amplifier has an inductance load at least at an input side of input and output sides.

15. The signal processor according to claim 11, wherein the composite signal is transmitted wirelessly.

16. The signal processor according to claim 15, wherein the composite signal is transmitted through a dielectric waveguide.

17. The signal processor according to claim 11, wherein one of the frequency converters frequency converts a converted signal in a frequency band, which is equal to or higher than 30 GHz, into a baseband signal.

18. A signal processing method comprising:
providing a signal processor with a plurality of frequency converters that frequency convert previously frequency converted input signal and outputs the inputs signals;
obtaining a composite signal composed of a combination of the previously frequency converted input signals;
distributing to each of the plurality of frequency converters one of the previously converted input signals; and
performing frequency conversion of the previously converted input signals by means of the frequency converters and outputting the input signals,
wherein
the plurality of frequency converters are in a one-chip semiconductor chip
a plurality of S/P converters which convert serial data into parallel data are also in the semiconductor chip, and
one of the frequency converters frequency converts a previously frequency converted input signal into serial data which is a baseband signal, and supplies the frequency-converted serial data to one of the S/P converters.

* * * * *